(12) United States Patent
Tervaluoto et al.

(10) Patent No.: US 8,023,923 B2
(45) Date of Patent: Sep. 20, 2011

(54) MIXER CIRCUIT

(75) Inventors: Jussi-Pekka Tervaluoto, Oulu (FI); Antti Ruha, Oulu (FI); Tarmo Ruotsalainen, Oulu (FI)

(73) Assignee: Nokia Corporation, Espoo (FI)

( * ) Notice: Subject to any disclaimer, the term of this patent is extended or adjusted under 35 U.S.C. 154(b) by 449 days.

(21) Appl. No.: 10/586,995

(22) PCT Filed: Jan. 22, 2004

(86) PCT No.: PCT/IB2004/000164
§ 371 (c)(1),
(2), (4) Date: Aug. 20, 2008

(87) PCT Pub. No.: WO2005/081398
PCT Pub. Date: Sep. 1, 2005

(65) Prior Publication Data
US 2008/0305759 A1    Dec. 11, 2008

(51) Int. Cl.
*H04B 1/26* (2006.01)
(52) U.S. Cl. .................. 455/326; 455/313; 455/323
(58) Field of Classification Search .................. 455/326
See application file for complete search history.

(56) References Cited

U.S. PATENT DOCUMENTS

| 4,392,112 A | 7/1983 | Schade |
| 4,947,135 A | 8/1990 | Mijuskovic ............... 330/9 |
| 6,125,272 A | 9/2000 | Bautista et al. |
| 6,381,449 B1 * | 4/2002 | Yamaji et al. ............. 455/313 |
| 6,889,037 B2 * | 5/2005 | Darabl ..................... 455/323 |
| 2003/0129958 A1 | 7/2003 | Behzad |

FOREIGN PATENT DOCUMENTS

EP    0410295    1/1991

OTHER PUBLICATIONS

"Tail current flicker noise reduction in LC VOCs by complementary switched biasing," ICM, Kassim et al., Dec. 9, 2003, pp. 102-105, XP010697431, Cairo, Egypt.
Chinese Office Action for corresponding application No. 200480037356.7 dated Jul. 31, 2009, 2 pages filled in Office Action form in English, 23 pages English translation of Text of Second Office Action and 24 pages Chinese originals of both the form and the Text of the Office Action, 49 pages total.

* cited by examiner

*Primary Examiner* — Duc Nguyen
*Assistant Examiner* — Ajibola Akinyemi (57) ABSTRACT

The invention relates to a mixer circuit 31 comprising a down-conversion mixing component 33 arranged for down-converting an input radio frequency signal Irf+, Irf−. In order to improve such a mixer circuit, it is proposed that it comprises in addition an active mixer load circuit 34 connected to output terminals of the mixing component. The active mixer load circuit includes an active mixer load 51, T1, T2 and modulating means S1-S4 arranged for modulating a flicker noise produced by the active mixer load away from the signal band of a signal Ibb+, Ibb− output by the down-conversion mixing component. The invention relates equally to a receiver, a chip and a device comprising such a mixer circuit and to a method for use with such a mixer circuit.

10 Claims, 5 Drawing Sheets

MIXER CIRCUIT

CROSS-REFERENCE TO RELATED APPLICATION

This application is in the U.S. National Stage of International Application Number PCT/IB/2004/000164 filed Jan. 22, 2004 published Sep. 1, 2005 under International Publication Number WO 2005/081398 A1 in the English language.

FIELD OF THE INVENTION

The invention relates to a mixer circuit comprising a down-conversion mixing component arranged for down-converting an input radio frequency signal. The invention relates equally to a receiver circuit, an apparatus and a chip comprising such a mixer circuit. The invention further relates to a method for use in such a mixer circuit.

BACKGROUND OF THE INVENTION

A mixer circuit with a down-conversion mixing component for down-converting a radio frequency (RF) signal can be used in particular in an RF receiver.

Figure 1:
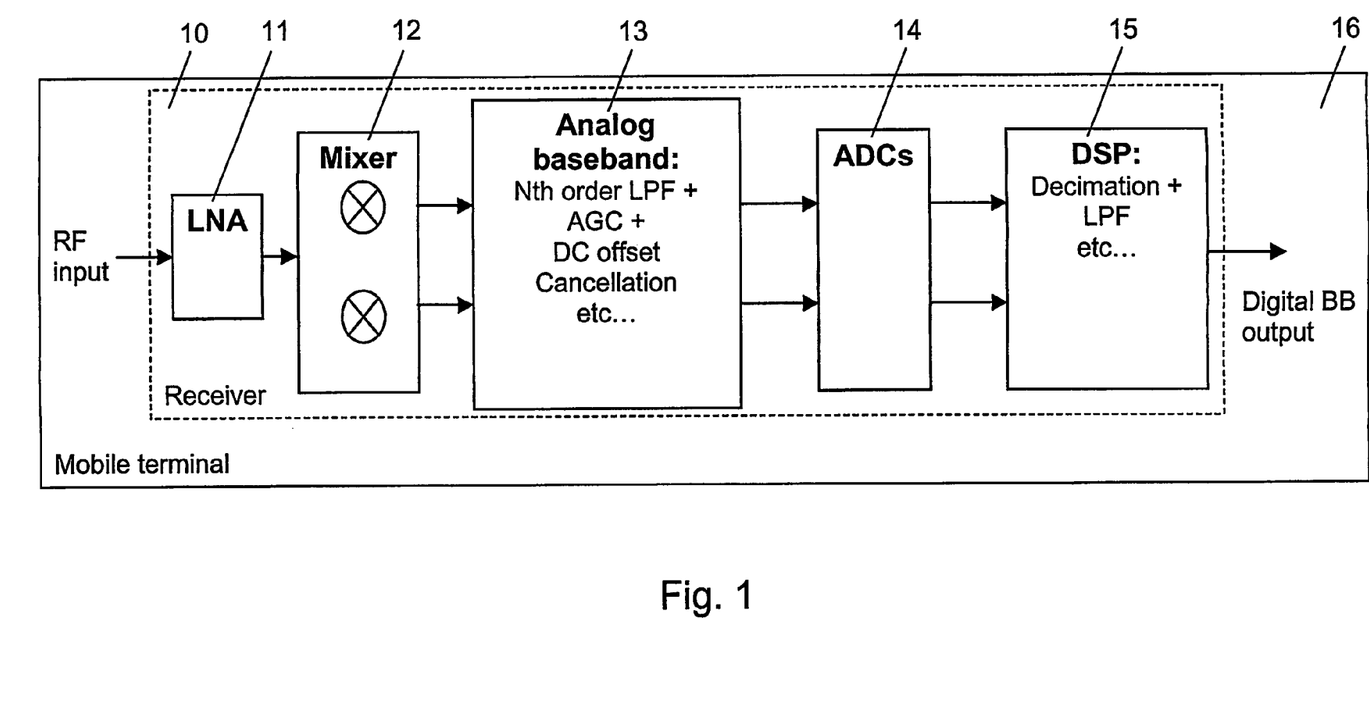
FIG. 1 is a block diagram of a conventional direct conversion receiver, in which the invention can be implemented.

For illustration, a block diagram of an exemplary analog direct conversion receiver 10 is presented as FIG. 1.

The depicted receiver 10 comprises a low noise amplifier (LNA) 11 for amplifying received RF signals, mixers 12 for down-converting the amplified RF signals, an analog signal processing component 13 for processing the down-converted signals, analog-to-digital converters (ADC) 14 for converting the processed analog signals into digital signals, and a digital signal processing component (DSP) 15 for a further processing of the digital signals. For processing the analog down-converted signal, the analog signal processing component 13 comprises an Nth-order low-pass filter (LPF), an analog gain control (AGC), a direct-current (DC) offset cancellation, etc. For processing the digital signal, the DSP 15 comprises a decimation stage, an LPF, etc. The output of the DSP 15 constitutes the digital baseband (BB) output.

The receiver 10 can be integrated for example in a mobile terminal 16 for receiving and processing RF signals transmitted by a mobile communication network.

Figure 2:
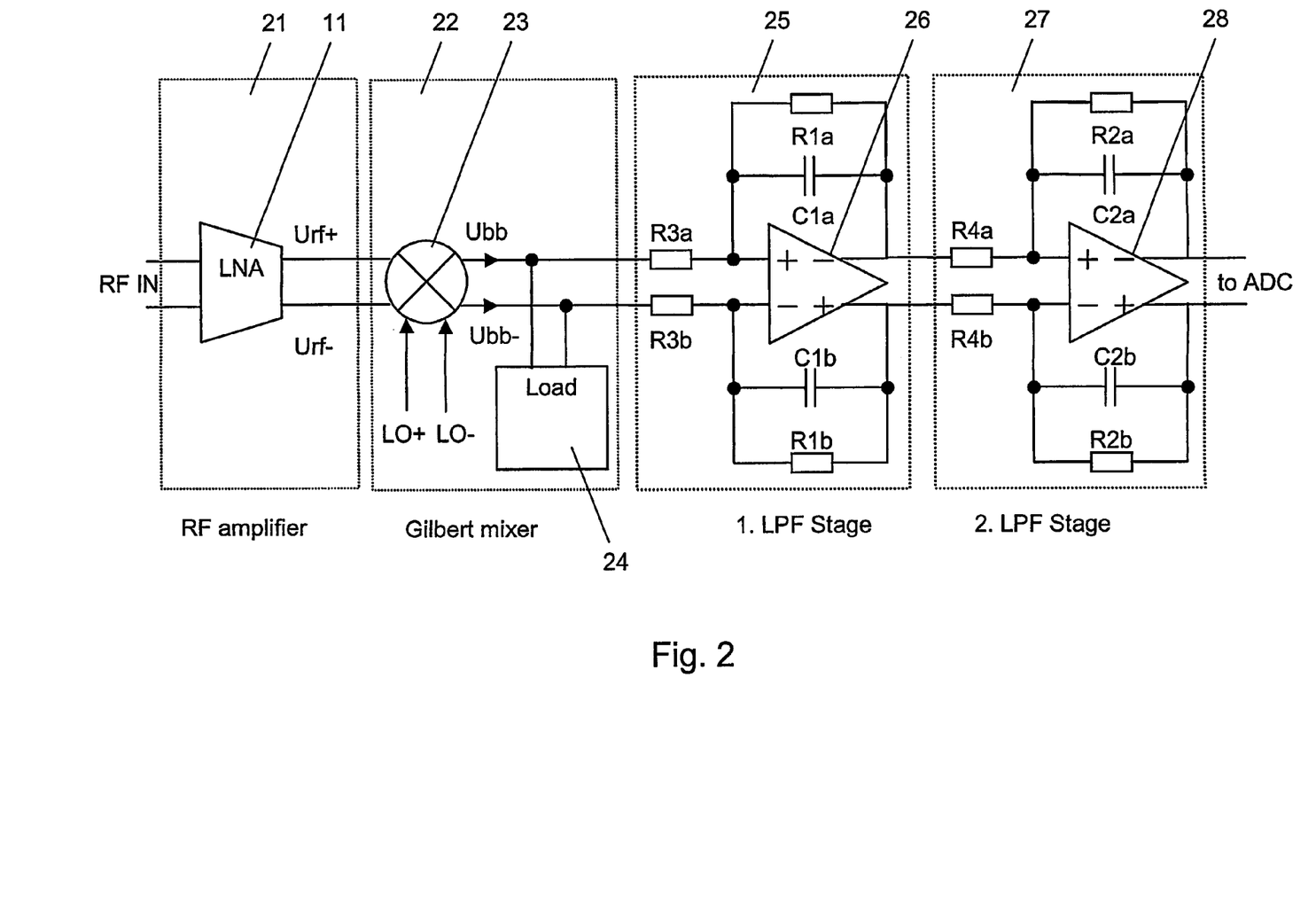
FIG. 2 is a schematic circuit diagram presenting conventional implementation details of the RF and analog front-end of the direct conversion receiver of FIG. 1.

FIG. 2 is a schematic circuit diagram of a straightforward implementation of the front end of the receiver of FIG. 1. The circuit of FIG. 2 comprises an RF amplifier 21 with the LNA 11, a Gilbert cell 22 as mixers 12, and two LPF stages 25, 27 as analog baseband filter of the analog signal processing component 13. Instead of the depicted second order LPF 25, 27, a higher order LPF can be used as well.

The LNA 11 comprises two input terminals and two output terminals. The LNA 11 amplifies received RF signals RF IN and outputs the amplified signals as voltages Urf+ and Urf−. The outputs terminals of the LNA 11 are connected to two signal input terminals of a down-conversion mixing component 23 of the Gilbert cell 22. The mixing component 23 receives via two additional input terminals alternating local oscillator signals LO+ and LO−, which enable a down-conversion of input radio frequency signals RF IN. The resulting baseband signals are output as voltages Ubb+ and Ubb− via a respective output terminal. The output of the mixing component 23 is moreover connected within the Gilbert cell 22 to a mixer load 24.

The first output terminal of the mixing component 23 is connected via a first input terminal of the first LPF stage 25 and a resistor R3a to a first input of an operational amplifier 26 of the first LPF stage 25, and a first output of operational amplifier 26 is connected to a first output terminal of the first LPF stage 25. A capacitor C1a on the one hand and a resistor R1a on the other hand are arranged in parallel to each other between the first input and the first output of the operational amplifier 26.

The second output terminal of the mixing component 22 is connected via a second input terminal of the first LPF stage 25 and a resistor R3b to a second input of the operational amplifier 26, and a second output of the operational amplifier 26 is connected to a second output terminal of the first LPF stage 25. A capacitor C1b on the one hand and a resistor R1b on the other hand are arranged in parallel to each other between the second input and the second output of the operational amplifier 26.

The first output terminal of the first LPF stage 25 is connected via a first input terminal of the second LPF stage 27 and a resistor R4a to a first input of an operational amplifier 28 of the second LPF stage 27, and a first output of the operational amplifier 28 is connected to a first output terminal of the second LPF stage 27. A capacitor C2a on the one hand and a resistor R2a on the other hand are arranged in parallel to each other between the first input and the first output of the operational amplifier 28.

The second output terminal of the first LPF stage 25 is connected via a second input terminal of the second LPF stage 27 and a resistor R4b to a second input of the operational amplifier 28, and a second output of the operational amplifier 28 is connected to a second output terminal of the second LPF stage 27. A capacitor C2b on the one hand and a resistor R2b on the other hand are arranged in parallel to each other between the first input and the first output of the operational amplifier 28.

The two LPF stages 25, 27 apply a second order low pass filtering on the baseband signals Ubb+ and Ubb− received from the Gilbert mixer 22. The resulting low-pass filtered baseband signals are forwarded to the analog-to-digital converters 14 of FIG. 1.

Implementing a receiver with such a direct conversion architecture has the advantage that it is cheaper than other conversion architectures, like super-heterodyne architectures, since expensive band pass filter components for an intermediate frequency (IF) are not required in a direct conversion.

It is further of advantage to realize a receiver as a system on chip (SoC) solution, that is, to implement the components of the receiver on a single chip. Cost, size and other reasons would make the use of the deep sub-micron Complementary Metal Oxide Semiconductor (CMOS) technology attractive for such an SoC solution.

When using a deep sub-micron CMOS implementation, however, the flicker noise, which is also referred to as 1/f noise as it is inversely proportional to the frequency, has to be taken into account. Flicker noise is especially a problem in second generation (2G) systems like the Global System for Mobile Communications (GSM) and, to a lesser extent, as well in third generation (3G) systems. The noise problem is increased with modem and future CMOS technologies which require a low supply voltage. As the supply voltage decreases, also the noise has to decrease. An additional difficulty with a lower supply voltage is the linearity. As the threshold and saturation voltages are consuming in the case of a low supply voltage a larger portion of the supply voltage range, the linearity is worse with lower supply voltages than with higher supply voltages. The conventional direct conversion receiver will therefore be increasingly difficult to implement in future low voltage processes.

An important component of a direct conversion receiver and the most critical one in terms of linearity and noise is the mixer. A conventional direct conversion receiver comprises a passive load for the mixer, which is composed of a resistor and a capacitor to provide a suitable signal gain and a first order attenuation for interferences. Such a passive mixer load is difficult to design for a desired gain, a desired noise and a desired linearity, as these factors are all linked together through the bias current of the mixing component and the load impedance. A conventional mixer structure will therefore have considerable noise and linearity problems in modern CMOS architectures operating with a low supply voltage.

The noise problems in a direct conversion receiver can be avoided by using a Bipolar Complementary Metal Oxide Semiconductor (BiCMOS) based chip for the critical RF and baseband blocks.

Therefore, usually the digital baseband components of a direct conversion receiver, like the DSP, are implemented using CMOS technology. The RF components of a direct conversion receiver, including the LNA, the mixers and the analog baseband signaling processing component, in contrast, are usually implemented using BiCMOS technology or other analog-oriented semiconductor processes. Thus, a complete receiver is usually implemented using at least two separate chips for RF and digital baseband, which increases the production costs.

SUMMARY OF THE INVENTION

It is an object of the invention to provide an alternative mixer circuit. It is in particular an object of the invention to provide a mixer circuit which allows to achieve a sufficient mixer linearity without increasing the flicker noise.

A mixer circuit is proposed, which comprises a down-conversion mixing component arranged for down-converting an input radio frequency signal and an active mixer load circuit. The active mixer load circuit is connected to output terminals of the down-conversion mixing component. The active mixer load circuit includes an active mixer load and modulating means arranged for modulating a flicker noise produced by the active mixer load away from the signal band of a signal output by the down-conversion mixing component.

Moreover, a receiver circuit for receiving radio frequency signals and for providing corresponding down-converted signals, a chip and an apparatus are proposed, each comprising the proposed mixer circuit.

Finally, a method for use in a mixer circuit comprising a down-conversion mixing component and an active mixer load circuit is proposed. The proposed method comprises down-converting a received radio frequency signal by means of the down-conversion mixing component. The proposed method further comprises controlling an output voltage of the down-conversion mixing component by means of an active mixer load of the active mixer load circuit. The proposed method further comprises modulating a flicker noise produced by the active mixer load away from the signal band of the down-converted radio frequency signal.

The invention proceeds from the consideration that, especially for low voltage applications, an active mixer load is more suitable for a mixer circuit than a passive mixer load. An active mixer load offers a greater freedom in designing the mixer for a desired performance, in particular in optimizing the voltage gain and the head-room and thus the linearity. If an active mixer load is employed in a mixer circuit, the common mode (CM) and the differential impedances can be separated and can be designed independently from each other to be low and high, respectively. With a passive load, these factors are tied together.

If the passive mixer load of a conventional mixer circuit is substituted by an active mixer load, however, the additional noise due to the active mixer load, especially the additional flicker noise, will be a problem in the signal band of the down-converted signal, for example in the baseband in GSM. Therefore, it is proposed that in addition, the flicker noise of the active mixer load is modulated away from the signal band.

Compared to a mixer circuit comprising a passive mixer load, it is thus an advantage of the invention that the active mixer load enables a better mixer linearity, that is, a better third order interception point (IIP3). Further, it allows an active load control to be used for controlling the common mode voltage of the output nodes of the mixer circuit.

Compared to a straightforward active mixer load topology, it is an advantage of the invention that the flicker noise added by an active mixer load is lowered, as the proposed modulation means are able to remove the flicker noise from the signal band. The low noise level in the signal band is achieved by the use of modulation techniques and no low noise process is needed to reduce the flicker noise.

The proposed modulation does not lower the flicker noise caused by the down-converting mixing component itself. This noise can be lowered in addition, though, since the bias current of the mixing component can be lowered due to the improved linearity.

As noise is removed from the signal band by modulation, a CMOS technology or another "noisy" semiconductor technology, in particular a deep sub-micron semiconductor technology, can be used for implementing the mixer circuit in a chip with a sufficient mixer performance. Thus, the invention provides a solution to the problem related to the interface between a down-conversion mixing component and, for example, subsequent baseband processing components which are implemented with a sub-micron CMOS technology. As a result, the invention enables the implementation of an entire receiver using modern deep sub-micron semiconductor processes with a low supply voltage, and in particular the implementation of an entire receiver in a SoC type of solution.

The modulation means can comprise for instance switching elements. The use of a switching or chopping technique for analog circuits in general is known in the state of the art, for instance for Sigma-Delta modulators and instrumentation amplifiers. A switching technique for use in a receiver has also been described in U.S. Pat. No. 6,125,272, but not in combination with an active mixer load.

The down-conversion mixing component can be adapted to down-convert either radio frequency current mode signals or radio frequency voltage mode signals.

The proposed mixer circuit can be implemented in RF circuits using digital or analog semiconductor technologies. It is especially suitable for a pure sub-micron digital CMOS process, without any additional process options.

The proposed mixer circuit can be employed for example in a direct conversion receiver or in any IF receiver, like a low-IF receiver or a heterodyne receiver, etc. Further, a receiver in which the proposed mixer circuit is implemented can belong to any type of radio system.

The proposed apparatus can be in particular an apparatus comprising a receiver for which the proposed mixer circuit is employed. Such an apparatus can be for example a mobile terminal or a network element of a radio communication network.

BRIEF DESCRIPTION OF THE FIGURES

Other objects and features of the present invention will become apparent from the following detailed description considered in conjunction with the accompanying drawings.

DETAILED DESCRIPTION OF THE INVENTION

The invention is implemented by way of example in the direct conversion receiver 10 presented above with reference to FIG. 1.

Figure 3:
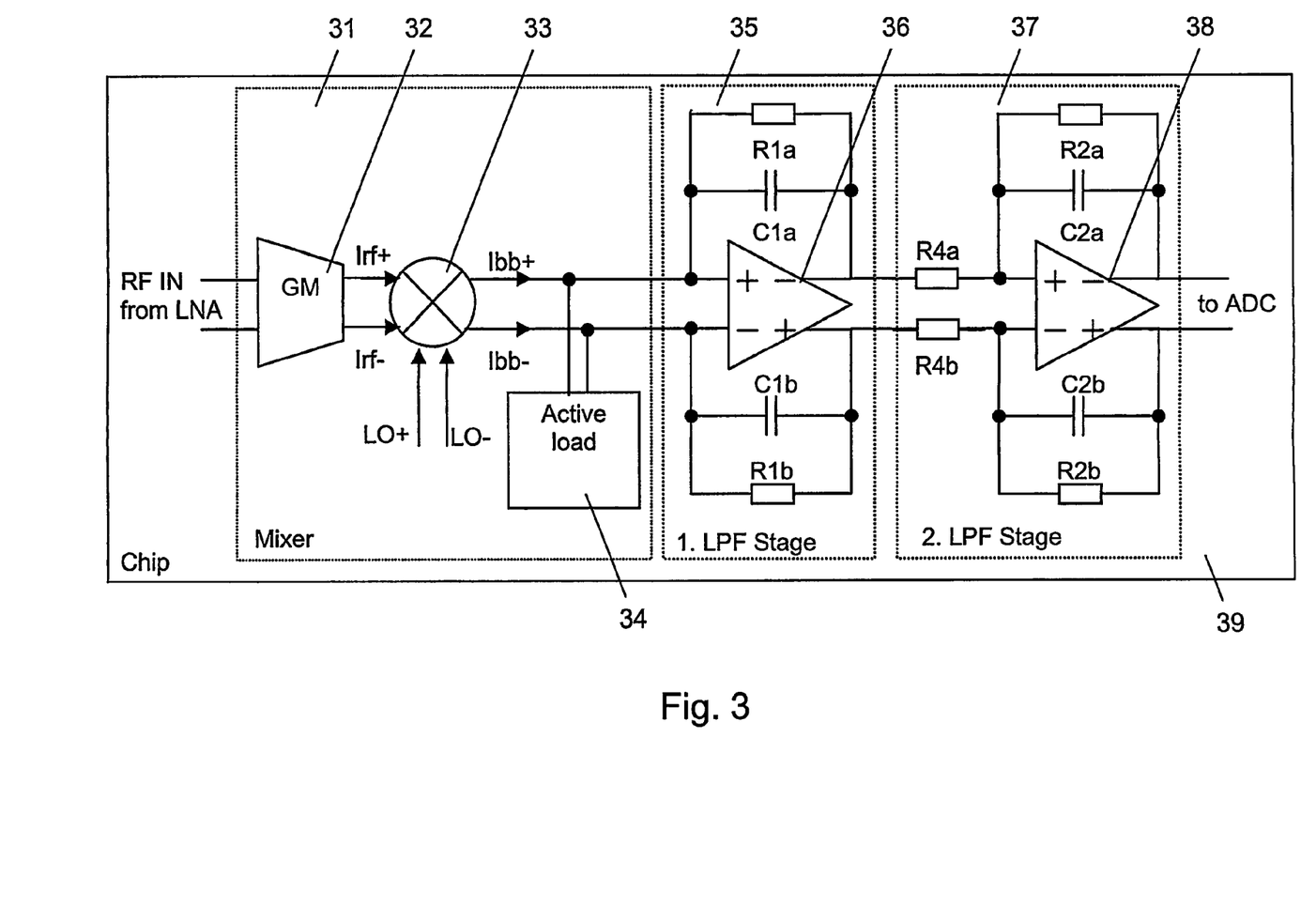
FIG. 3 is a schematic circuit diagram presenting an implementation of the RF and analog front-end of a direct conversion receiver in accordance with the invention.

FIG. 3 depicts details of the RF and analog front-end of the receiver 10 of FIG. 1, in which an embodiment of a mixer circuit according to the invention is employed.

The circuit of FIG. 3 includes the mixer circuit 31, a first LPF stage 35 and a second LPF stage 37.

The mixer circuit 31 comprises two input terminals, which are connected to the output of the LNA 11 of FIG. 1. Within the mixer circuit 31, the input terminals are connected via a transconductance element GM 32 and a mixing component 33 to output terminals of the mixer circuit 31. The mixing component 33 comprises additional input terminals for receiving alternating local oscillator signals LO+ and LO−. Moreover, an active mixer load circuit 34 is connected to the output terminals of the mixing component 33.

The first output terminal of the mixer circuit 31 is connected via a first input terminal of the first LPF stage 35 to a first input of an operational amplifier 36 of the first LPF stage 35, and a first output of the operational amplifier 36 is connected to a first output terminal of the first LPF stage 35. A capacitor C1a on the one hand and a resistor R1a on the other hand are arranged in parallel to each other between the first input and the first output of the operational amplifier 36.

The second output terminal of the mixer circuit 31 is connected via a second input terminal of the first LPF stage 35 to a second input of the operational amplifier 36, and a second output of operational amplifier 36 is connected to a second output terminal of the first LPF stage 35. A capacitor C1b on the one hand and a resistor R1b on the other hand are arranged in parallel to each other between the first input and the first output of the operational amplifier 36.

The first output terminal of the first LPF stage 35 is connected via a first input terminal of the second LPF stage 37 and a resistor R4a to a first input of an operational amplifier 38 of the second LPF stage 37, and a first output of the operational amplifier 38 is connected to a first output terminal of the second LPF stage 37. A capacitor C2a on the one hand and a resistor R2a on the other hand are arranged in parallel to each other between the first input and the first output of the operational amplifier 38.

The second output terminal of the first LPF stage 35 is connected via a second input terminal of the second LPF stage 37 and a resistor R4b to a second input of the operational amplifier 38, and a second output of the operational amplifier 38 is connected to a second output terminal of the second LPF stage 37. A capacitor C2b on the one hand and a resistor R2b on the other hand are arranged in parallel to each other between the first input and the first output of the operational amplifier 38.

As the arrangement of the capacitors C1a, C1b, C2a, C2b and resistors R1a, R1b, R2a, R2b, R4a, R4b in the LPF stages 35, 37 is the same as in the LPF stages 25, 27 of FIG. 2, the same reference signs were used.

The two output terminals of the second LPF stage 37, finally, are connected to the analog-to-digital converter 14 of the receiver 10 of FIG. 1.

In the presented embodiment, the receiver 10 is realized as a SoC solution, that is, all components of the receiver 10 shown in FIGS. 1 and 3 are integrated in a single deep submicron CMOS chip 39.

Figure 4:
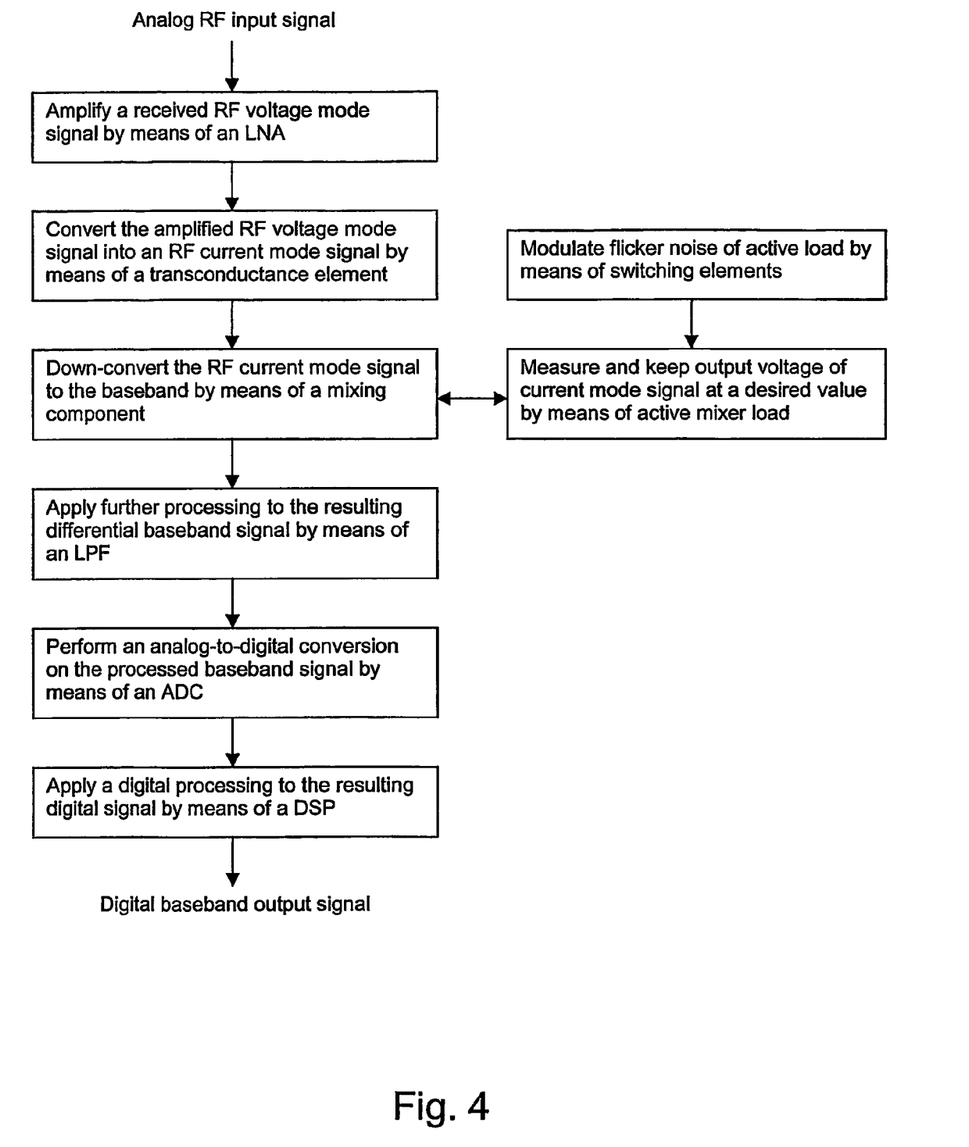
FIG. 4 is a flow chart illustrating the operation of a receiver according to the invention.

The operation of the receiver of FIG. 1 comprising the RF and analog front-end presented in FIG. 3 will now be explained with reference to FIG. 4.

Received RF voltage mode signals RF input are first amplified by the LNA 11. Next, the amplified RF voltage mode signals RF IN are converted by the transconductance element 32 into RF current mode signals Irf+ and Irf−. The transconductance element 32 may comprise to this end one or two transistors.

The RF current mode signals Irf+ and Irf− are then down-converted to the baseband by the mixing component 33 by means of the alternating local oscillator signals LO+ and LO−. The mixing component 33 may comprise to this end down-conversion transistors.

The active mixer load circuit 34 measures the current mode baseband signals Ibb+ and Ibb− output by the mixing component 33 band and keeps the output voltage at a desired value. The design and the operation of the active mixer load circuit 34 will be described in more detail further below with reference to FIG. 5.

The differential current mode baseband signals Ibb+ and Ibb− are now fed to the analog baseband processing portion 13 for further processing. The current mode interface brings an additional advantage with respect to the linearity. The analog baseband processing comprises a second order low pass filtering with the two LPF stages 35, 37 shown in FIG. 3. The low pass filtered signals are then converted by the ADCs 14 into the digital domain and the digital baseband signals are further processed by the DSP 15, before they are output by the receiver as digital baseband output.

Figure 5:
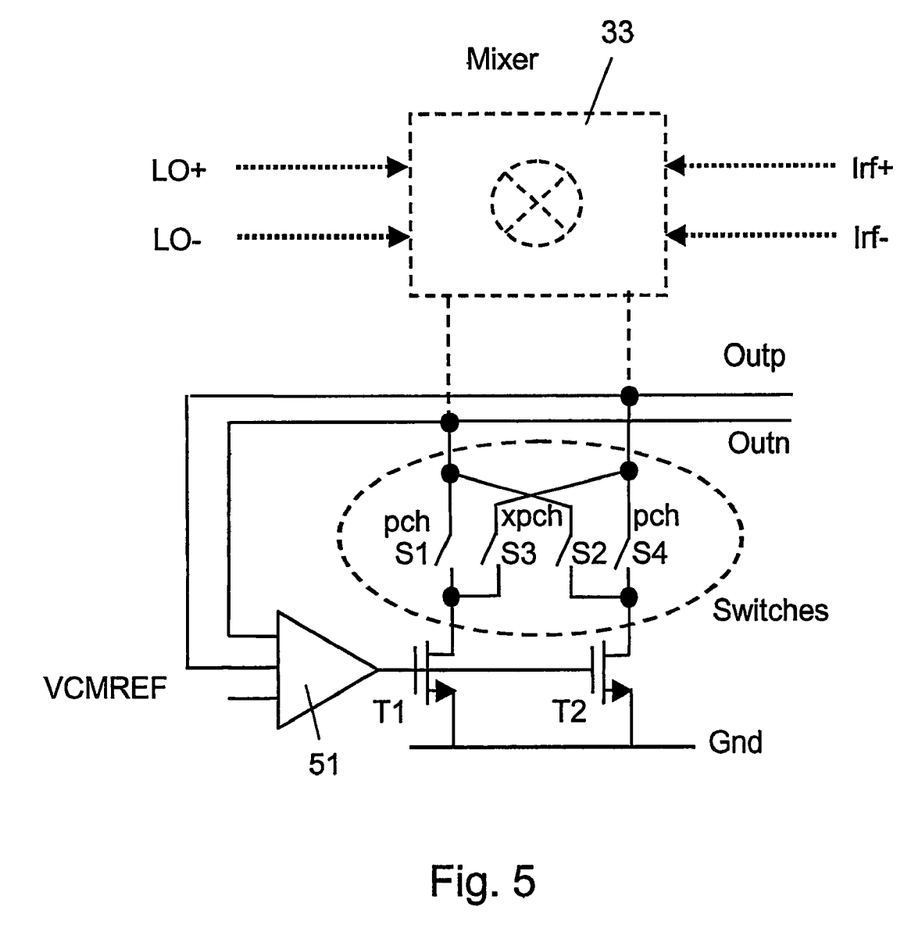
FIG. 5 is a schematic circuit diagram illustrating an embodiment of a switched active load of a mixer according to the invention.

FIG. 5 is a diagram showing details of the active mixer load circuit 34 of the mixer circuit 31 of FIG. 3.

The mixing component 33 of the mixer circuit 31 and its connection to the active mixer load circuit is indicated by dotted lines. The mixer circuit 31 receives as input signals the RF current mode signals Irf+ and Irf− and in addition local oscillator signals LO+ and LO−, as described above with reference to FIGS. 3 and 4.

The output terminals of the mixer circuit 31 are connected on the one hand to the first LPF stage 35, as described with reference to FIG. 3. The signals provided to the first LPF stage 35 are referred to in FIG. 5 as Outp and Outn. In the embodiment of FIG. 3, the signals Outp and Outn thus correspond to the current mode baseband signals Ibb+ and Ibb−. In another embodiment, the signals Outp and Outn of FIG. 5 may also be voltage mode signals supplied to a subsequent LPF stage, which depends on the type of connection of the mixer circuit to the subsequent LPF stage.

Both output terminals of the mixer circuit 31 are further connected to a respective input of an operational amplifier 51. A common mode reference voltage VCMREF is provided to a third input of the operational amplifier 51. The output of the operational amplifier 51 is connected to the respective gate of two transistors T1, T2. The operational amplifier 51 and the transistors T1 and T2 form the actual active mixer load.

The first output terminal of the mixer circuit 31 can be connected in addition via a first switching element S1 and the first transistor T1 to ground Gnd. The first output terminal of the mixer circuit 31 can be connected via a second switching element S2 and the second transistor T2 to ground Gnd.

The second output terminal of the mixer circuit 31 can be connected in addition via a third switching element S3 and the first transistor T1 to ground Gnd. The second output terminal of the mixer circuit 31 can be connected via a fourth switching element S4 and the second transistor T2 to ground Gnd.

In a conventional active mixer load, in contrast, the first output terminal of a mixing component is fixedly connected via a first transistor to ground, while the second output terminal of a mixing component is fixedly connected via a second transistor to ground.

In the active mixer load circuit of FIG. 5, the switching elements S1 to S4 are included in order to remove the flicker noise due to the actual active mixer load 51, T1, T2. Switching elements S1 and S4 are closed to this end alternately with switching elements S2 and S3. The control signal for switching elements S1 and S4 is denoted in FIG. 5 with pch and the complementary control signal for switching elements S2 and S3 switching is denoted in FIG. 5 with xpch. The switcher can be considered as modulating means or as a modulator. With such a switching operation, it can be ensured that the flicker noise of the active mixer load circuit 34 is modulated away from the baseband to a band around the switching frequency i.e., away from the signal band of the signal output by the down-conversion mixing component. As a result, the flicker noise problem of a conventional active mixer load is avoided.

As noise is removed from the signal band by modulation, a CMOS based chip can be used for the implementation of the mixer circuit.

The presented embodiment thus provides a solution to an important problem related to the interface between the down conversion mixer circuit 31 of a direct conversion receiver and the following baseband processing components implemented with sub-micron CMOS technology. It facilitates the SoC implementation and enhances the possibilities for integrating the RF part with the digital baseband using the CMOS technology. The SoC solution results in lower product costs, since two chips, that is one for the RF part and one for the baseband part, are replaced by a single chip.

The flicker noise and the mismatch of the actual signal down-conversion transistors in the mixing component 33 are not touched by the presented embodiment. The above cited document U.S. Pat. No. 6,125,272 describes a possibility of compensating the mismatch of down-conversion transistors of a mixing component and of improving the resulting second order non-linearity of the mixing component (IIP2), which could be combined with the presented embodiment.

It is to be noted that the described embodiment constitutes only one of a variety of possible embodiments of the invention.

The invention claimed is:

1. Apparatus comprising:
   a down-conversion mixing component arranged for down-converting an input radio frequency signal; and
   an active load circuit connected to output terminals of said down-conversion mixing component, wherein said active load circuit includes an active load and modulator arranged for modulating a flicker noise produced by said active load away from a signal band of a signal output by said down-conversion mixing component, wherein said active mixer load includes a first transistor, a second transistor and an operational amplifier, wherein a first output terminal of said down-conversion mixing component is connected to a first input of said operational amplifier, wherein a second output terminal of said down-conversion mixing component is connected to a second input of said operational amplifier, wherein a reference common mode voltage is applied to a reference common mode voltage input of said operational amplifier, wherein an output of said operational amplifier is connected in parallel to a respective gate of said first transistor and said second transistor, and wherein said switching elements are arranged for connecting alternately on the one hand said first output terminal of said down-conversion mixing component via said first transistor and said second output terminal of said down-conversion mixing component via said second transistor to ground, and on the other hand said first output terminal of said down-conversion mixing component via said second transistor and said second output terminal of said down-conversion mixing component via said first transistor to ground.

2. The apparatus according to claim 1, wherein said down-conversion mixing component is adapted to down-convert radio frequency current mode signals.

3. The apparatus according to claim 1, wherein said down-conversion mixing component is adapted to down-convert radio frequency voltage mode signals.

4. Receiver circuit for receiving radio frequency signals and for providing corresponding down-converted signals, said receiver circuit comprising the apparatus according to claim 1.

5. Receiver circuit according to claim 4, wherein at least said mixing circuit and at least one component of said receiver circuit arranged for processing digital baseband signals are integrated in a single chip.

6. Chip comprising at least the apparatus according to claim 1.

7. Chip according to claim 6, wherein said apparatus is implemented on said chip with a deep sub-micron semiconductor technology.

8. A mobile terminal comprising a receiver circuit for receiving radio frequency signals and for providing corresponding down-converted signals, said receiver circuit comprising the apparatus according to claim 1.

9. Method comprising:
   down-converting a received radio frequency signal by means of a down-conversion mixing component;
   controlling an output voltage of said down-conversion mixing component by means of an active load of an active load circuit; and
   modulating a flicker noise produced by said active load away from a signal band of said down-converted radio frequency signal, wherein said active load circuit includes a first transistor, a second transistor and an operational amplifier, wherein a first output terminal of said down-conversion mixing component is connected to a first input of said operational amplifier, wherein a second output terminal of said down-conversion mixing component is connected to a second input of said operational amplifier, wherein a reference common mode voltage is applied to a reference common mode voltage input of said operational amplifier, wherein an output of said operational amplifier is connected in parallel to a respective gate of said first transistor and said second transistor, and wherein switching elements are arranged for connecting alternately on the one hand said first output terminal of said down-conversion mixing component via said first transistor and said second output terminal of said down-conversion mixing component via said second transistor to ground, and on the other hand said first output terminal of said down-conversion mixing component via said second transistor and said second output terminal of said down-conversion mixing component via said first transistor to ground.

10. Apparatus, comprising:

means for down-converting an input radio frequency signal; and means for providing an active load and means for modulating connected to output terminals of said means for down-converting for modulating a flicker noise produced by said means for providing an active load away from a signal band of a signal output by said means for down-converting, wherein said means for providing an active load includes a first transistor, a second transistor and an operational amplifier, wherein a first output terminal of said means for down-converting is connected to a first input of said operational amplifier, wherein a second output terminal of said means for down-converting is connected to a second input of said operational amplifier, wherein a reference common mode voltage is applied to a reference common mode voltage input of said operational amplifier, wherein an output of said operational amplifier is connected in parallel to a respective gate of said first transistor and said second transistor, and wherein said means for modulating comprises switching elements arranged for connecting alternately on the one hand said first output terminal of said means for down-converting via said first transistor and said second output terminal of said means for down-converting via said second transistor to ground, and on the other hand said first output terminal of said means for down-converting via said second transistor and said second output terminal of said means for down-converting via said first transistor to ground.

* * * * *